United States Patent
Lai et al.

(10) Patent No.: US 6,757,161 B2
(45) Date of Patent: Jun. 29, 2004

(54) TURNING COVER OF A DETACHABLE TYPE AND ASSEMBLY METHOD THEREOF

(75) Inventors: Cheng-Shing Lai, Taipei (TW); Jie Yuan, NanJing (CN); Jia-Jun Cao, NanJing (CN)

(73) Assignee: Inventec Appliances Corp., Taipei (TW)

( * ) Notice: Subject to any disclaimer, the term of this patent is extended or adjusted under 35 U.S.C. 154(b) by 0 days.

(21) Appl. No.: 10/243,934

(22) Filed: Sep. 16, 2002

(65) Prior Publication Data

US 2003/0111940 A1 Jun. 19, 2003

(51) Int. Cl.$^7$ ................................................ G06F 1/16

(52) U.S. Cl. ...................... 361/683; 312/223.2; 345/156

(58) Field of Search ................................ 361/679–683; 312/223.1, 2; 345/156, 168

(56) References Cited

U.S. PATENT DOCUMENTS

| | | | |
|---|---|---|---|
| 6,239,968 B1 * | 5/2001 | Kim et al. | 361/679 |
| 6,317,313 B1 * | 11/2001 | Mosgrove et al. | 361/680 |
| 6,519,142 B1 * | 2/2003 | Lai et al. | 361/683 |

FOREIGN PATENT DOCUMENTS

EP 1309155 A1 * 5/2003 ............ H04M/1/02

* cited by examiner

Primary Examiner—Lisa Lea-Edonds
(74) Attorney, Agent, or Firm—Rabin & Berdo, P.C.

(57) ABSTRACT

A removable cover assembly is to be assembled to the main body member of the electronic product. The main body member includes an upper housing and a lower housing. The lower housing has a groove of the rotation axis and at least one groove of the leading rail and the upper housing has a groove of the affixing buckling hook. The removable cover assembly includes a cover member and an affixing pushing cover, wherein the cover member includes a cover and a rotation axis that is affixed to both sides of the cover. The affixing pushing cover includes an affixing buckling hook and at least one leading rail, wherein the leading rail is located at the back side of the affixed pushing cover, and is with respect to the position of the groove of the leading rail. The affixing buckling hook is located on a side of the affixing pushing cover and is with respect to a position of a groove of the affixing buckling hook. During assembly, the rotation axis on the cover is engaged in tabling to the groove of the rotation axis, so that the cover member and the lower housing are in combination. In addition, the leading rail on the affixing pushing cover can slide along the groove of the leading rail until the affixing buckling hook and the groove of the affixing buckling hook are buckled up. The present invention can allow the user to promptly detach or attach the cover, according to the user's actual need.

13 Claims, 6 Drawing Sheets

TURNING COVER OF A DETACHABLE TYPE AND ASSEMBLY METHOD THEREOF

This application incorporates by reference Taiwan application Serial No. 090131395, filed Dec. 18, 2001.

BACKGROUND OF THE INVENTION

1. Field of the Invention

This invention relates to a removable cover and the assembly method thereof, and more particularly, the invention relates to the removable cover having an affixing pushing cover. As a result, after the cover has been assembled, it can be affixed to an electronic product.

2. Description of Related Art

Electronic information products have become increasingly necessary in the work or the personal environment for the modern people. In particular, the portable electronic products, such as the personal digital assistant (PDA), which have been designed to be light, thin, and compact in order to be used at any time and in any place, for managing business, processing documents, accessing the Internet, or receiving/sending electronic mail. The portable products offer much convenience and have become popular in the current market.

The product used for electronic information usually has a display screen and a cover to protect the display screen. Taking the PDA as an example, when the PDA is not in use, the cover can provide good protection for the display screen. At the same time, it also can improve the appearance of the product in better delicacy. However, while the PDA is in use, the cover cannot be completely rolled over to the back of the PDA, and the operation would be a hindrance and would not be convenience for the user. In addition, when the cover is opened in stretch, the size of the product becomes larger. For this reason, many users, who are operating a PDA with the cover attached, feel that the PDA without the cover would be more convenient.

From the foregoing points, it has been the goal of the manufacturer to make the cover of the electronic product in a small type which offers protection for the product and convenience for the user.

SUMMARY OF THE INVENTION

It is therefore an objective of the present invention to provide a removable cover and the assembly method thereof. As a result, the cover can be easily detached from or mounted on the electronic product.

In accordance with the foregoing and other objectives of the present invention, the invention provides a removable cover assembly, so as to be assembled to the main body member of the electronic product, in which the main body member includes an upper housing and a lower housing. The lower housing has a groove for rotation axis and at least one groove of the leading rail and the upper housing has a groove of the affixing buckling hook. The removable cover assembly includes a cover member used to cover the main body member and an affixing pushing cover used to affix the affixing pushing cover of the removable cover assembly. The removable cover assembly includes a cover and a rotation axis, and both ends of the cover separately has a rotation axis hole, so that they can be fit to the rotation axis by the rotation manner. The affixing pushing cover includes an affixing buckling hook and at least a leading rail, wherein the leading rail is located at the back side of the affixed pushing cover, with respect to the position of the groove of the leading rail. The affixing buckling hook is located on a side of the affixing pushing cover, with respect to a position of the groove of the affixing buckling hook.

During assembly, the rotation axis on the cover is engaged in tabling to the groove of the rotation axis, so that the cover member and the lower housing are in combination. In addition, the leading rail on the affixing pushing cover can slide along the groove of the leading rail until the affixing buckling hook and the groove of the affixing buckling hook are connected.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
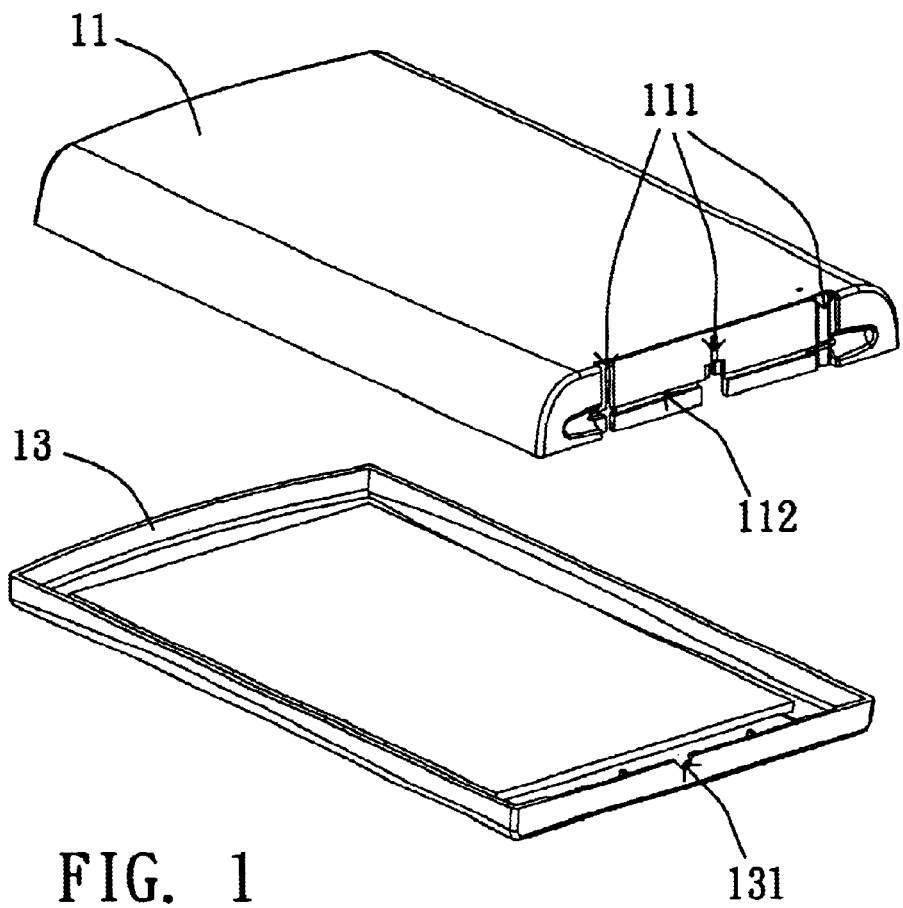
FIG. 1 is a drawing, schematically illustrating the main body member of a personal digital assistant, according to one preferred embodiment of the present invention.

The present invention is directed to a removable cover assembly, which can be coupled to an electronic product in a manner so that the user can mount it on or detach it from the electronic product, according to the user's actual need. The characteristics of the technology includes using an affixing pushing cover to affix the cover to a side of the electronic product, so that the cover can have the rotation relative to the electronic product without dropping out. When the user intends to detach the cover, the affixing pushing cover is first moved and then the cover is detached. Then, the affixing pushing cover is pushed back to the original position. The integrated appearance of the electronic product can thereby remain, wherein the electronic product being applied can be any handheld product, such as the cellular phone, the personal digital assistant (PDA), or the smartphone. Actually, the present invention has no specific limitation to the electronic products in practical application.

In the following, a personal digital assistant (PDA) is taken as the example of the electronic product, in accordance with the drawings for the detailed descriptions. In addition, in order to clearly describe the features of the present invention in accordance with the drawings, some other subject matters, which are not directly related to the present invention, are not shown in the drawings. This is to avoid some potential bias and confusion about the features of the present invention.

In the preferred embodiment of the present invention, the PDA with a cover comprises a main body member and a removable cover assembly, wherein the main body member includes an upper housing and a lower housing, and the removable cover assembly includes a cover member and an affixing pushing cover.

Referring to FIG. 1, it is a drawing, schematically illustrating the main body member of a PDA, according to one preferred embodiment of the present invention. In FIG. 1, the main body member includes a lower housing 11 and an upper housing 13, in which the side of the lower housing 11 has three grooves of leading rails 111 and a groove of the rotation axis 112, and the side of the upper housing 13 has a groove of the affixing buckling hook 131.

Figure 2:
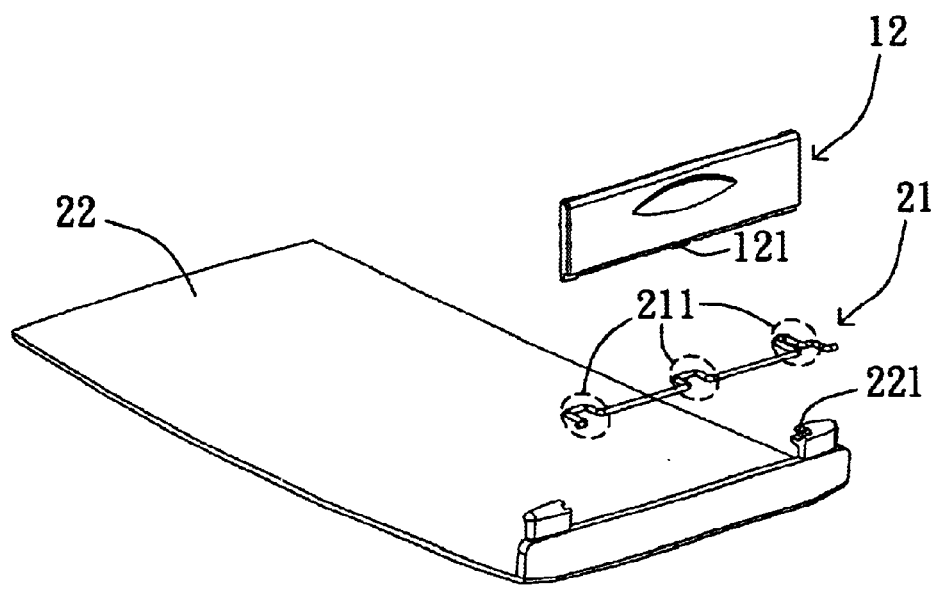
FIG. 2 is a drawing, schematically illustrating the removable cover assembly, according to one preferred embodiment of the present invention.

Referring to FIG. 2, it is a drawing, schematically illustrating the removable cover assembly, according to one preferred embodiment of the present invention. In FIG. 2, the removable cover assembly includes the cover member and an affixing pushing cover 12, in which the cover member comprises a cover 22, a rotation axis 21, and a hole of the rotation axis 221, which is respectively formed at both sides of the cover 22, so as to allow the rotation axis 21 to be engaged by the rotation manner.

In order to understand each assembly element in further detail, enlarged views or the different views are used to illustrate each assembly element in the following description.

Figure 3A:
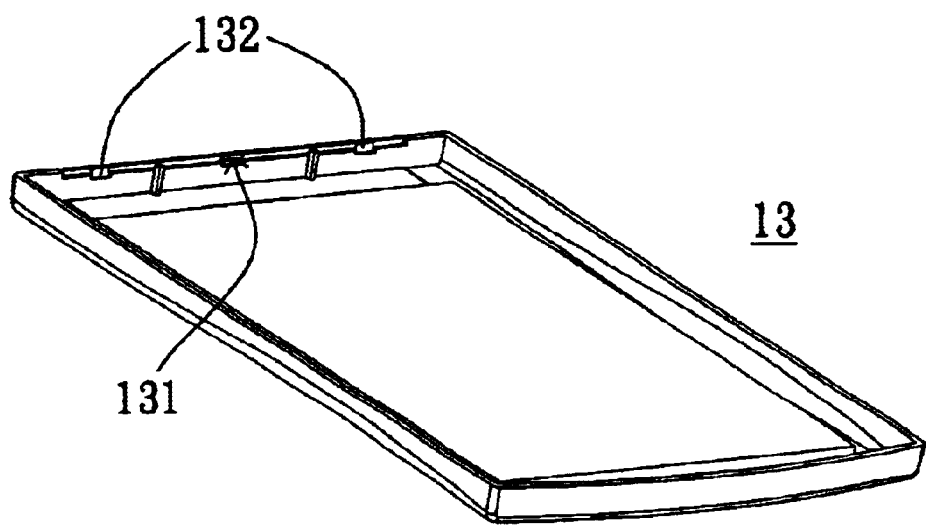
FIG. 3A is a drawing, schematically illustrating an upper housing in magnified scale.

FIG. 3A is a drawing, schematically illustrating an upper housing in magnified scale. FIG. 3A and FIG. 1 offer different views of the upper housing element. In these views, an inner structure with respect to the lower housing after being assembled can be seen. The side of the upper housing 13 has a groove of the affixing buckling hook 131 at the central part. In addition, both sides also include a holding baffle 132.

Figure 3B:
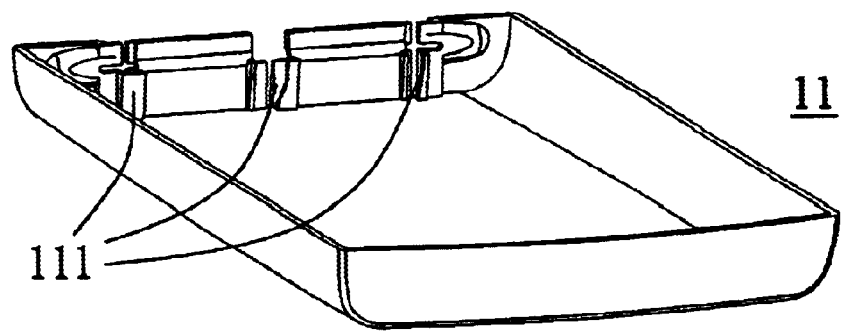
FIG. 3B is a drawing, schematically illustrating a lower housing in magnified scale.

FIG. 3B is a drawing, schematically illustrating a lower housing in magnified scale. FIG. 3B and FIG. 1 offer different views of the lower housing. In these views, an inner structure with respect to the upper housing after being assembled can be seen. The side of the lower housing 11 has a groove of the rotation axis 112 in a horizontal direction (as shown in FIG. 1). In addition, the lower housing 11 is also implemented with three grooves of leading rails 111.

Since the cover of the present invention can be attached or detached according to the user's actual need, the assembly situation for the cover not being needed is first described as follows.

Figure 4A:
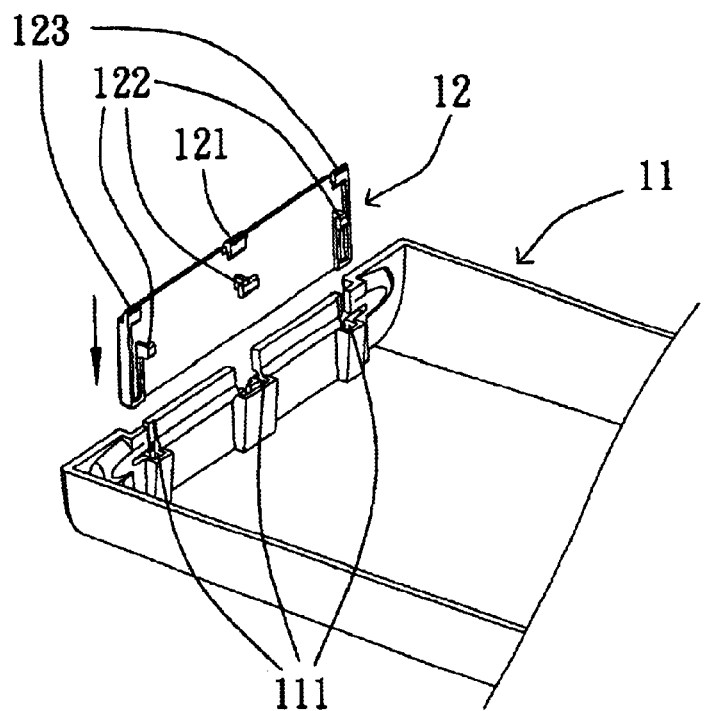
FIG. 4A is a drawing, schematically illustrating an assembling mechanism for the affixing pushing cover and the lower housing.

FIG. 4A is a drawing, schematically illustrating an assembling mechanism for the affixing pushing cover and the lower housing. As shown in FIG. 4A, there is an affixing buckling hook 121 at the side of the affixing pushing cover 12 and there are three leading rails 122 evenly distributed on the side surface thereof, in which the two side leading rails are the L-type leading rails and the middle leading rail is a T-type leading rail. The positions of the leading rails 122 correspond to the positions of the grooves of leading rails 111. The front ends of the L-type leading rails are further formed as holding buckling hooks 123. While the elements are in assembly, the leading rails 122 are sliding along the grooves of leading rails 111 on the lower housing 11 until the respective affixing buckling hook and the groove of the affixing buckling hook are engaged in buckling. Since the end of the groove of the leading rail 111 is closed, when the leading rail 122 of the affixing pushing cover 12 does contact with the end of the groove of the leading rail 111, it then stops without sliding off the main body member.

Figure 4B:
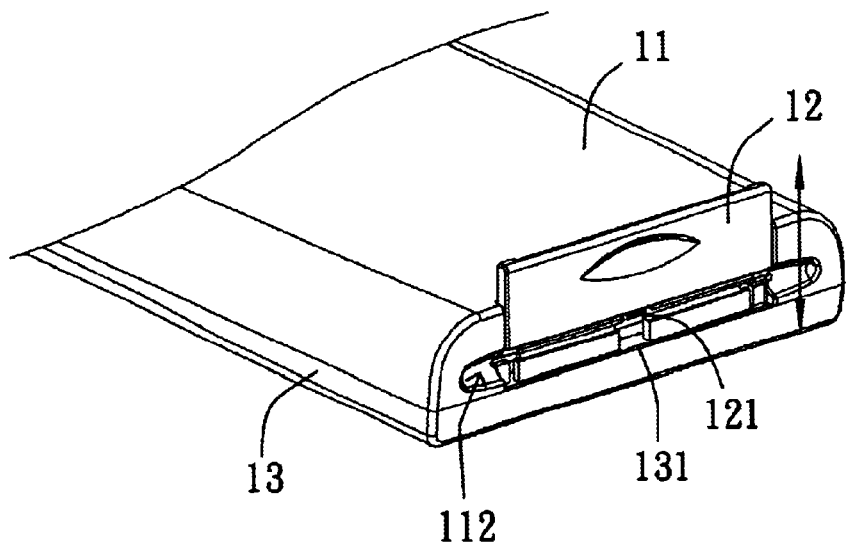
FIG. 4B is a drawing, schematically illustrating a sliding situation for the affixing pushing cover on the lower housing after assembly.

FIG. 4B is a drawing, schematically illustrating a sliding situation for the affixing pushing cover on the lower housing after being assembled. As shown in FIG. 4B, when the user does not need the cover, the PDA comprises the main body member and the affixing pushing cover 12, and the affixing buckling hook 121 of the affixing pushing cover as well as the groove of the affixing buckling hook 131 of the upper housing 13 are engaged by buckling manner, so as to maintain the integration of the outer appearance. When the user does need the cover, the user needs only to shift the affixing pushing cover 12, causing the groove of the rotation axis 112 to be exposed for being disposed with the rotation axis of the affixing pushing cover 22.

Figure 5:
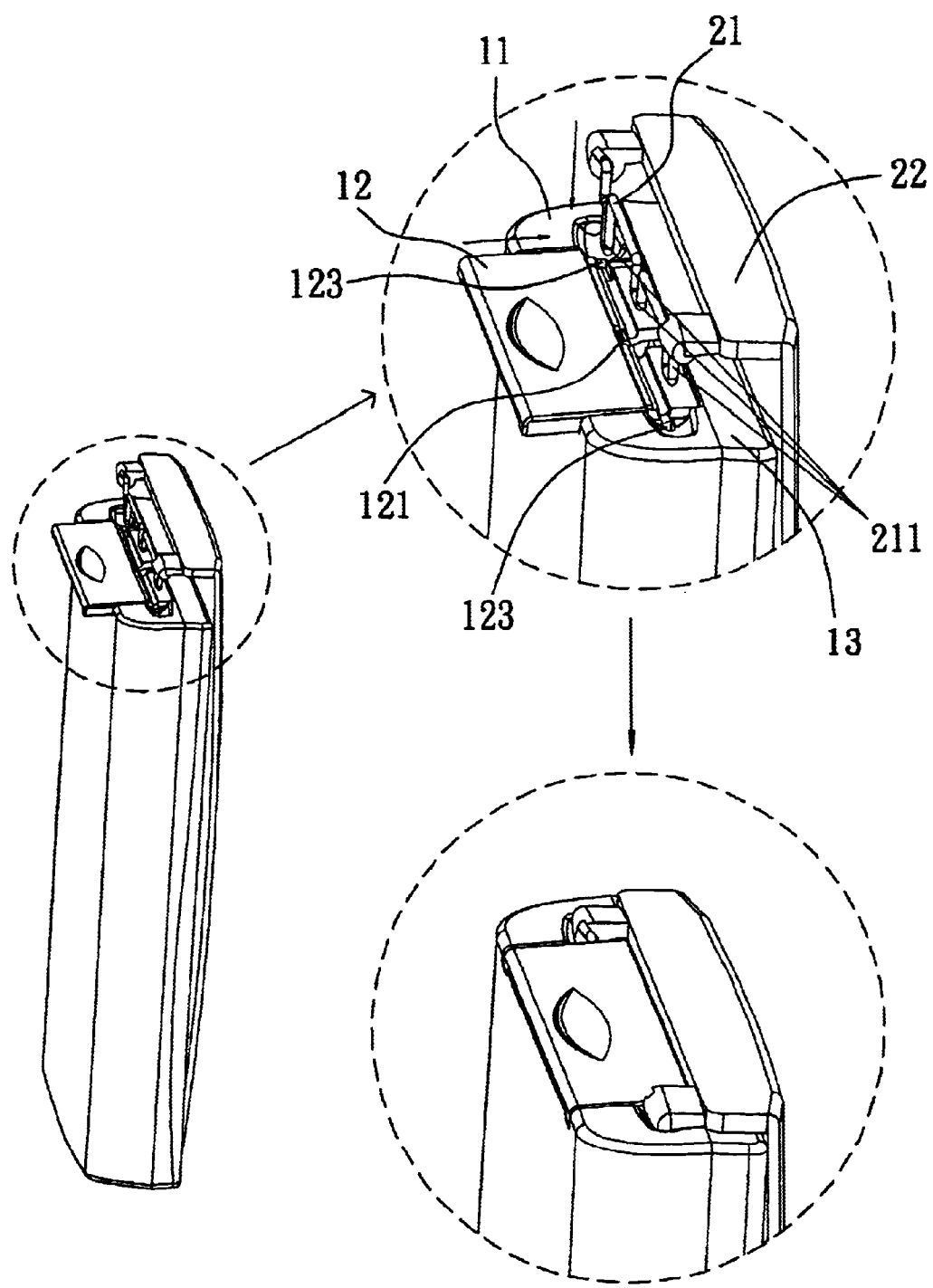
FIG. 5 is a drawing, schematically illustrating the assembling mechanism for the cover and the main body member.

FIG. 5 is a drawing, schematically illustrating the assembling mechanism for the cover and the main body member. At first, the affixing pushing cover 12 is set to the opened state, and then a U-type device 211 of the rotation axis 21 is inserted into the lower housing 11 until the rotation axis 21 is fit into the groove of the rotation axis 112. Then, the affixing pushing cover 12 is pushed until it is engaged in the closed state.

Figure 6A:
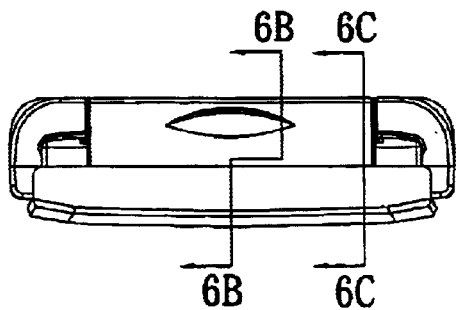
FIG. 6A is a drawing, schematically illustrating a top view of the cover and the main body member in FIG. 5 after being assembled.
Figure 6B:
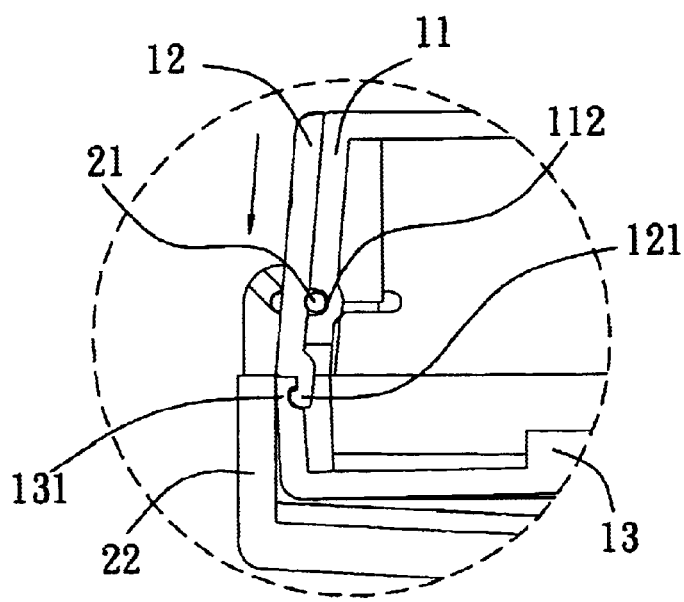
FIG. 6B is a drawing, schematically illustrating a cross-sectional view of the assembled cover and main body member in FIG. 6A along the line of 6B-6B.

FIG. 6A is a drawing, schematically illustrating a top view of the cover and the main body member in FIG. 5 after being assembled. FIG. 6B is a drawing, schematically illustrating a cross-sectional view of the assembled cover and main body member in FIG. 6A along the line of 6B—6B. As shown in FIG. 6B, it can seen that the rotation axis 21 is fit into the groove of the rotation axis 112, and the affixing buckling hook 121 is buckled to the groove of the affixing buckling hook 131, in order to prevent the affixing pushing cover from sliding. As a result, the rotation axis 21 is then affixed to the groove of the rotation axis 112 by the affixing pushing cover 12. Since the hole of rotation axis 221 on the cover 22 is engaged by fitting in the rotation type with the rotation axis 21, the cover 22 can rotate around the main body part.

Figure 6C:
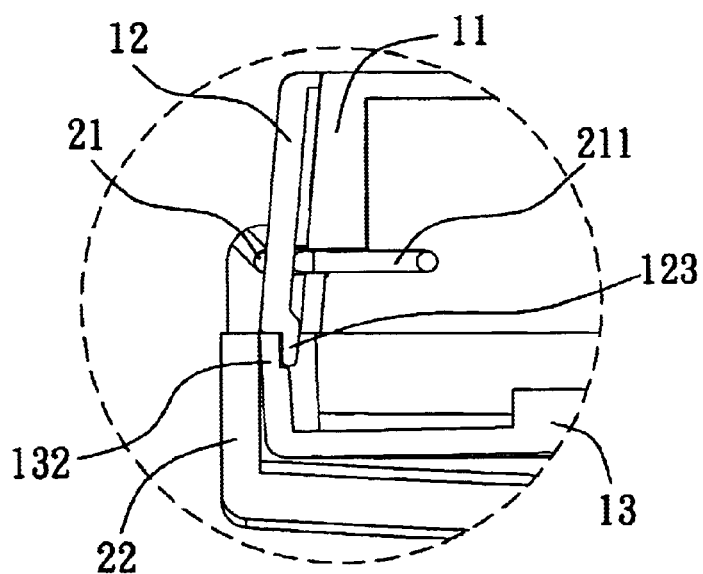
FIG. 6C is a drawing, schematically illustrating a cross-sectional view of the assembled cover and main body member in FIG. 6A along the line of 6C-6C.

FIG. 6C is a drawing, schematically illustrating a cross-sectional view of the assembled cover and main body member in FIG. 6A along the line of 6C—6C. As shown in FIG. 6C, it can be seen that the U-type device 211 has the function to prevent a rotation of the rotation axis 21 inside the groove of the rotation axis 112. In addition, the holding buckling hole 123 of the affixing pushing cover 12 is used to stop the holding baffle 132 of the upper housing 13, so as to take the load of the interaction force that is induced when the cover 22 is rotating and is perpendicular to the sliding direction along the leading rail 122.

Figure 7A:
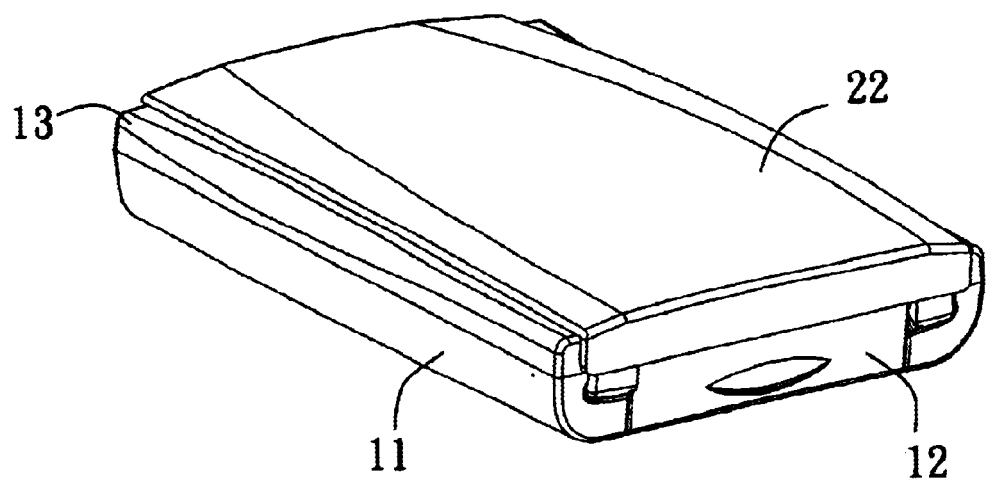
FIG. 7A is a drawing, schematically illustrating a PDA with the cover, according to one preferred embodiment of the present invention.
Figure 7B:
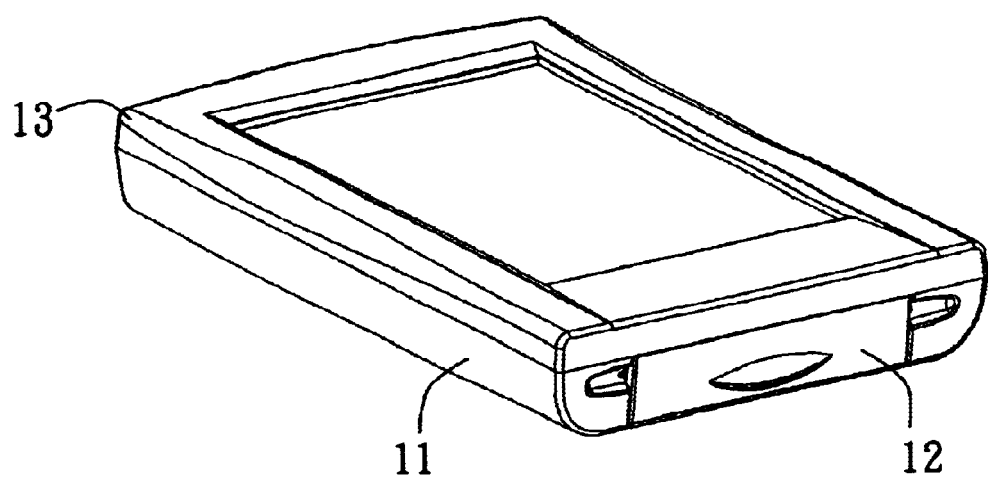
FIG. 7B is a drawing, schematically illustrating a PDA without the cover, according to one preferred embodiment of the present invention.

FIG. 7A is a drawing, schematically illustrating a PDA with the cover, according to one preferred embodiment of the present invention. FIG. 7B is a drawing, schematically illustrating the PDA without the cover, according to one preferred embodiment of the present invention. The cover 22 can be detached or attached according to the user's actual need. However, the affixing pushing cover 12 still remains on the PDA, so as to maintain the whole outer appearance in integration. It is noted that the material for the cover 22 can be an elastic material, such as rubber, leather, and so on, so as to improve the tactile feeling when it is in use. However, there is no limitation for the material.

In conclusion, the foregoing preferred embodiment of the present invention has disclosed the removable cover and the assembly method thereof. The advantages include: (1) the cover can be freely detached or attached, so as to provide for the user with a free choice; (2) the assembly method is rather simple and convenient; (3) the affixing pushing cover is designed to make the outer appearance still integrated when the electronic product does not have the cover; (4) the cover of the detachable type would not increase the volume of the electronic product, whether or not the product is in use; and (5) the cover after be assembled can be well affixed to the electronic product without concerns of it dropping off.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A removable cover assembly, used to be assembled with a main body member of an electronic product, wherein the main body member includes a lower housing and an upper housing, the removable cover assembly comprising:
   a groove of rotation axis, implemented on the lower housing;
   at least one groove of leading rail, implemented on the upper housing;
   a groove of affixing buckling hook, implemented on the upper housing;
   a cover member, used to cover the main body member, comprising:
      a cover, the cover having a rotation axis hole at each side; and
      a rotation axis, engaged with the rotation axis hole by a rotation manner; and
   an affixing pushing cover, used to affix the cover member, comprising:
      at least one leading rail, located at a back side of the affixing pushing cover, and being with respect to a position of the at least one groove of leading rail; and
      an affixing buckling hook, located at a side edge of the affixing pushing cover, and being with respect to a position of the groove of affixing buckling hook;
   wherein, while in assembling, the rotation axis of the upper cover is engaged into the groove of rotation axis, so as to combine the cover member and the lower housing, and then, the leading rail of the affixing pushing cover is sliding along the groove of leading rail until the affixing buckling hook and the groove of affixing buckling hook are engaged in buckling.

2. The removable cover assembly as recited in claim 1, wherein the upper housing further comprises a holding baffle and the affixing pushing cover further comprises a holding buckling hook, after the affixing pushing cover and the main body member have been assembled, the holding baffle can stop the holding buckling hook, so have been assembled, the holding baffle can stop the holding buckling hook, so as to provide a strength while cover is rotated.

3. The removable cover assembly as recited in claim 1, wherein the rotation axis further comprises a U type device, used as a lead when the cover member and the lower housing are assembling and used to prevent a rotation for the rotation axis in the groove of rotation axis from occurring.

4. The removable cover assembly as recited in claim 1, wherein a plurality of leading rails are evenly distributed on the affixing pushing cover, and the lower housing has a plurality of grooves of leading rail with the same number of the leading rail.

5. The removable cover assembly as recited in claim 4, wherein the plurality of leading rails includes a T-type leading rail at a middle position and two L-type leading rails respectively located at two sides of the affixing pushing cover.

6. The removable cover assembly as recited in claim 1, wherein the electronic product comprises a personal digital assistant (PDA).

7. An electronic product with a removable cover, comprising:
   a main body member comprising:
      a lower housing, having a groove of rotation axis and at least one groove of leading rail at top of the lower housing; and
      an upper housing, having a groove of affixing buckling hook at top of the upper housing;
   a cover member, used to cover the main body member, comprising:
      a cover, the cover having a rotation axis hole at each side; and
      a rotation axis, engaged with the rotation axis hole by a rotation manner; and
   an affixing pushing cover, used to affix the cover member, comprising:
      at least one leading rail, located at a back side of the affixing pushing cover, and being with respect to a position of the at least one groove of leading rail; and
      an affixing buckling hook, located at a side edge of the affixing pushing cover, and being with respect to a position of the groove of affixing buckling hook;
   wherein, while in assembling, the rotation axis of the upper cover is engaged into the groove of rotation axis, so as to combine the cover member and the lower housing, and then, the leading rail of the affixing pushing cover is sliding along the groove of leading rail until the affixing buckling hook and the groove of affixing buckling hook are engaged in buckling.

8. The electronic product as recited in claim 7, wherein the upper housing further comprises a holding baffle and the affixing pushing cover further comprises a holding buckling hook, after the affixing pushing cover and the main body member have been assembled, the holding baffle can stop the holding buckling hook, so as to provide a strength while cover is rotated.

9. The electronic product as recited in claim 7, wherein the rotation axis further comprises a U type device, used as a lead when the cover member and the lower housing are assembling and used to prevent a rotation for the rotation axis in the groove of rotation axis from occurring.

10. The electronic product as recited in claim 7, wherein a plurality of leading rails are evenly distributed on the affixing pushing cover, and the lower housing has a plurality of grooves of leading rail with the same number of the leading rail.

11. The electronic product as recited in claim 7, the electronic product comprises a personal digital assistant (PDA).

12. A method for assembling an electronic product with a removable cover, wherein the electronic product comprises a main body member, a cover member, and an affixing pushing cover, the method comprising the steps of:

engaging a rotation axis of the cover member by a rotation manner to a groove of rotation axis on the main body member;

sliding a leading rail on the affixing pushing cover along the groove of leading rail on the main body member; and engaging an affixing buckling hook on the affixing pushing cover to a groove of affixing buckling hook on the main body member, so as to cover the groove of rotation axis and firmly engaged to the rotation axis therein.

13. The assembling method as recited in claim 12, wherein when the removable cover is detached off the electronic product, the method further comprises the step of:

sliding the affixing pushing cover along the groove of leading rail, so as to expose the rotation axis of the cover member;

removing the cover member from the main body member; and sliding the affixing pushing cover along the groove of leading rail until the affixing buckling hook and the groove of affixing buckling hook are buckled up.

* * * * *